United States Patent
Nakao et al.

(10) Patent No.: US 12,258,507 B2
(45) Date of Patent: Mar. 25, 2025

(54) FLUORESCENT DIAMOND AND METHOD FOR PRODUCING SAME

(71) Applicants: DAICEL CORPORATION, Osaka (JP); KYUSHU INSTITUTE OF TECHNOLOGY, Kitakyushu (JP)

(72) Inventors: Motoi Nakao, Kitakyushu (JP); Shinji Nagamachi, Amagasaki (JP); Masahiro Nishikawa, Tokyo (JP); Ming Liu, Tokyo (JP)

(73) Assignees: DAICEL CORPORATION, Osaka (JP); KYUSHU INSTITUTE OF TECHNOLOGY, Kitakyushu (JP)

( * ) Notice: Subject to any disclaimer, the term of this patent is extended or adjusted under 35 U.S.C. 154(b) by 823 days.

(21) Appl. No.: 17/290,105

(22) PCT Filed: Oct. 29, 2019

(86) PCT No.: PCT/JP2019/042401
§ 371 (c)(1),
(2) Date: Apr. 29, 2021

(87) PCT Pub. No.: WO2020/090825
PCT Pub. Date: May 7, 2020

(65) Prior Publication Data
US 2021/0395607 A1 Dec. 23, 2021

(30) Foreign Application Priority Data

Oct. 31, 2018 (JP) .................. 2018-206068

(51) Int. Cl.
C09K 11/65 (2006.01)
C01B 32/26 (2017.01)
(Continued)

(52) U.S. Cl.
CPC .............. *C09K 11/65* (2013.01); *C01B 32/26* (2017.08); *C01B 32/28* (2017.08);
(Continued)

(58) Field of Classification Search
CPC ......... C09K 11/65; C01B 32/28; C01B 32/26; C23C 16/0281; C23C 16/271;
(Continued)

(56) References Cited

U.S. PATENT DOCUMENTS

| 4,184,079 A | 1/1980 | Hudson et al. |
| 2010/0015438 A1* | 1/2010 | Williams .............. C30B 25/105 |
| | | 428/408 |
| 2017/0373153 A1* | 12/2017 | Narayan ................. C30B 13/06 |

FOREIGN PATENT DOCUMENTS

| CN | 107954421 A | 4/2018 |
| JP | 2005-306674 A | 11/2005 |

(Continued)

OTHER PUBLICATIONS

Extended European Search Report for European Application No. 19879810.0, dated Jul. 19, 2022.
(Continued)

*Primary Examiner* — Anita Nassiri-Motlagh
(74) *Attorney, Agent, or Firm* — Birch, Stewart, Kolasch & Birch, LLP (57) ABSTRACT

The present invention provides a fluorescent diamond containing an MV center emitting fluorescence at a concentration of $1 \times 10^{14}/cm^3$ or higher, where M represents a metal or metalloid, and V represents a vacancy.

12 Claims, 7 Drawing Sheets

(51) Int. Cl.
  *C01B 32/28* (2017.01)
  *C23C 16/02* (2006.01)
  *C23C 16/27* (2006.01)
  *C23C 16/56* (2006.01)
  *C30B 25/18* (2006.01)
  *C30B 29/04* (2006.01)
  *C30B 33/04* (2006.01)

(52) U.S. Cl.
  CPC ........ *C23C 16/0281* (2013.01); *C23C 16/271* (2013.01); *C23C 16/278* (2013.01); *C23C 16/56* (2013.01); *C30B 25/186* (2013.01); *C30B 29/04* (2013.01); *C30B 33/04* (2013.01)

(58) Field of Classification Search
  CPC ..... C23C 16/278; C23C 16/56; C30B 25/186; C30B 29/04; C30B 33/04
  USPC .................................................. 252/301.4 R
  See application file for complete search history.

(56) References Cited

FOREIGN PATENT DOCUMENTS

| | | |
|---|---|---|
| JP | 2009-46319 A | 3/2009 |
| JP | 2010-526746 A | 8/2010 |
| JP | 2012-41406 A | 3/2012 |
| JP | 2013-189373 A | 9/2013 |
| JP | 2014-95025 A | 5/2014 |
| JP | 2016-113310 A | 6/2016 |
| JP | 2016-117633 A | 6/2016 |
| JP | 2016-117852 A | 6/2016 |
| JP | 2018-136318 A | 8/2018 |
| RU | 2 434 977 C1 | 11/2011 |
| WO | WO 2006/136929 A2 | 12/2006 |
| WO | WO 2008/138841 A1 | 11/2008 |
| WO | WO 2017/108655 A1 | 6/2017 |

OTHER PUBLICATIONS

Green et al., "The neutral silicon-vacancy center in diamond: spin polarization and lifetimes," arxiv.org, Cornell University Library, 2017, 8 pages total.
Kiflawi et al., "The irradiation and annealing of Si-doped diamond single crystals, " Diamond and Related Materials, vol. 6, 1997, pp. 146-148.
Malykhin et al., "Photoluminescent properties of single crystal diamond microneedles," Optical Materials, vol. 75, 2018, pp. 49-55.
Nadolinny et al., "EPR Study of Germanium-Vacancy Defects in Diamonds," Journal of Structural Chemistry, vol. 57, No. 5, 2016, pp. 1041-1043.
Stacey et al., "Controlled synthesis of high quality micro/nano-diamonds by microwave plasma chemical vapor deposition," Diamond & Related Materials, vol. 18, 2009, pp. 51-55.
Yurievich, "Study of the Structure and Electronic State of Paramagnetic Centers in Diamond Associated with the Entry Phosphorus, Oxygen, Hydrogen, Silicon, and Germanium," Ph.D. Thesis in Chemical Sciences, Novosibirsk, 2016, 270 pages total, with English translation.
D'Haenens-Johansson et al., "Optical properties of the neutral silicon split-vacancy center in diamond", Physical Review B, vol. 84, No. 245208, 2011, pp. 245208-1-245208-14 (15 pages total).
Singaporean Written Opinion and Search Report dated Sep. 8, 2022 for Application No. 11202103772W.
International Search Report issued Dec. 24, 2019, in PCT/JP2019/042401.
Kagami et al., "Fabrication of SiV centers by ion implantation and the dependence of creation yield on the implantation energy," Proceedings of the 77th JSAP Autumn Meeting, Sep. 2016.
Lagomarsino et al., "Optical properties of silicon-vacancy color centers in diamond created by ion implantation and post-annealing," Diamond and Related Materials (Mar. 14, 2018), vol. 84, pp. 196-203.
Neu et al., "Narrowband fluorescent nanodiamonds produced from chemical vapor deposition films," Appl. Phys. Lett. (2011), vol. 98, pp. 243107-1-243107-3.
Osoekawa et al., "Introduction of SiV center in CVD diamond film by ion implantation," Lecture preprints of the JSAP Spring Meeting, vol. 62 (2015).
Written Opinion of the International Searching Authority mailed Dec. 24, 2019, in PCT/JP2019/042401.

\* cited by examiner

FLUORESCENT DIAMOND AND METHOD FOR PRODUCING SAME

TECHNICAL FIELD

The present invention relates to a fluorescent diamond, and a method for producing the same.

In the present specification, the following abbreviations are used.
MV center: metal-vacancy center
NV center: nitrogen-vacancy center
SiV center: silicon-vacancy center

BACKGROUND ART

A luminescent center in diamond is a nanosized chemically stable fluorescent chromophore and does not exhibit degradation, fading, or flickering in vivo, which often occur in organic fluorescent, and thus is expected as probes for fluorescence imaging. In addition, information on spins of electrons excited in the luminescent center can be sometimes measured from outside, and thus the luminescent center is also expected to be utilized in optically detected magnetic resonance (ODMR) or as a quantum bit.

The currently available luminescent center is a nitrogen-vacancy (NV) center, which is composed of a N atom as an impurity present in a lattice site in diamond and a vacancy occupying the lattice site adjacent to the N atom. There are two types of NV centers, $NV^0$, which is electrically neutral, and $NV^-$, in which one electron is captured in the vacancy site. Only the $NV^-$ center can be utilized in applications of ODMR or a quantum bit, while both can be utilized as probes for fluorescence imaging.

A NV center itself is rarely present in natural diamonds and is formed by irradiating an artificial diamond produced by a high temperature-high pressure method or plasma CVD method with an electron beam or ion beam to introduce vacancies and being subjected to proper annealing treatment. Such a process has been reported to be able to form NV centers up to a concentration of $1 \times 10^{18}/cm^3$. Most N present in natural diamonds is present as molecules or microbubbles, and thus, even if a natural diamond is subjected to a similar treatment, many luminescent centers referred to as H3 centers rather than NV centers would be formed. In artificial diamond, N is contained in atomic form and incorporated into a lattice site. Nitrogen is also often added to a raw material to allow nitrogen to function as a catalyst during diamond formation. A certain amount (e.g., from 10 ppm to 100 ppm) of N is thus originally contained and present in lattice sites during formation of artificial diamond. Thus, to form NV centers, vacancies are introduced, and annealing treatment is performed to allow the vacancies and N to meet and bond together.

Figure 1:
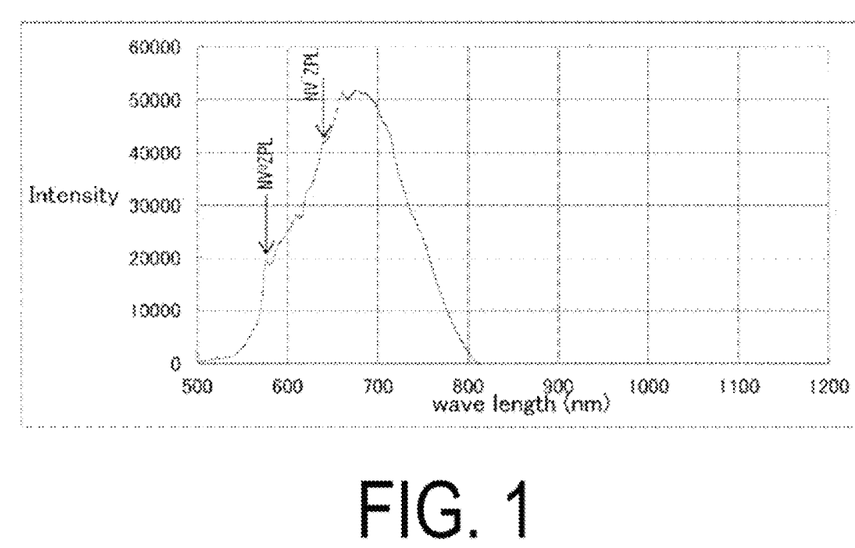
FIG. 1 is an example of a luminescence spectrum of an NV center (an excitation wavelength of 488 nm).

As shown in FIG. 1, fluorescence luminescence wavelength spectrum is composed of a sharp peak referred to as a zero phonon line (ZPL) and a broad peak referred to as a subband. Only ZPL can be utilized in applications of ODMR or a quantum bit, and thus only approximately 4% of the luminescence can be effectively utilized. When an NV center is applied as a probe for fluorescence imaging, all emission can be utilized; however, in this case, autofluorescence (fluorescence emitted by a biological tissue itself or body fluid) interferes with a measurement as noise, thus the broad wavelength distribution degrades the S/N ratio, and results in a decreased sensitivity.

Figure 6:
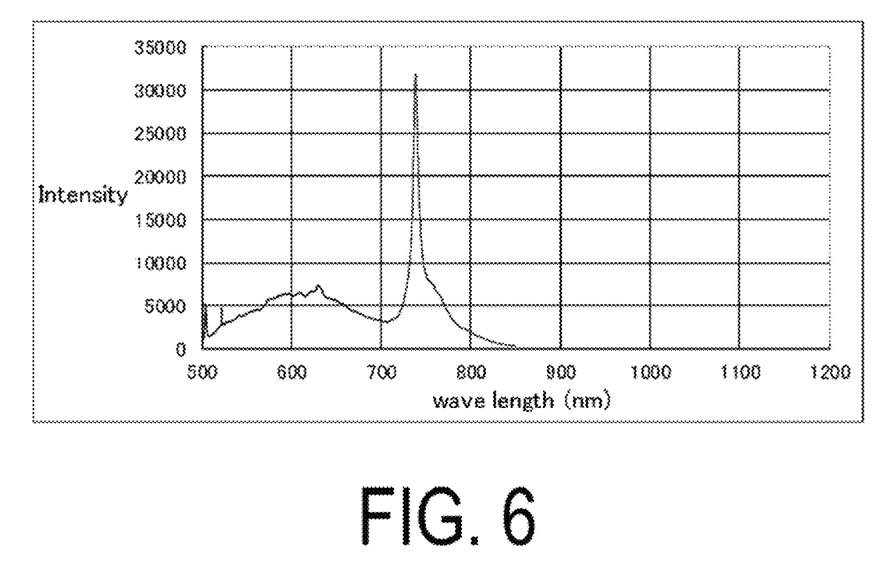
FIG. 6 is a PL measurement result after completion of ion irradiation and annealing treatment of the diamond film in Example 1.

On the other hand, also available is a luminescent center such as exhibiting a luminescence spectrum in which most of the luminescence is of ZPL. An SiV center (Non-Patent Literature 1) and a GeV center (Patent Document 1) correspond to such a luminescent center. An example of a luminescence spectrum of an SiV center is shown in FIG. 6. About 70% of the luminescence is of ZPL, the peak width is small, and thus the noise effect due to autofluorescence is small. In particular, the SiV center has the ZPL at 738 nm located in what is called biological window (a wavelength band where excitation light or fluorescence penetrates the living body). This enables external excitation and external measurement, and thus the SiV center is an ideal luminescent center as a probe for bioimaging.

CITATION LIST

Patent Document

Patent Document 1: JP 2016-117852 A

Non-Patent Literature

Non-Patent Literature 1: E. Neu et al. APPLIED PHYSICS LETTERS 98, 243107 (2011)

SUMMARY OF INVENTION

Technical Problem

As described above, methods for producing NV centers have been established to some extent, and NV centers can be produced at high concentrations. However, techniques for producing high concentrations of other luminescent centers, especially SiV centers expected for utility, are still under development by trial and error.

In a high-temperature-high-pressure diamond or a plasma CVD diamond, which is used as a raw material for producing NV centers, few or no SiV centers are formed by introducing Si by ion implantation. Reported methods for producing SiV centers include an example in which a diamond film was formed on a Si substrate by hot filament CVD or plasma CVD, and SiV centers were formed in the resulting polycrystalline diamond; and another example in which Si was introduced by ion implantation into a high purity natural diamond (type IIa) or a high purity artificial diamond (plasma CVD method), and the diamond was subjected to annealing treatment. However, the concentrations of SiV luminescent centers formed by both methods have been reported to be significantly low, and the efficiencies of luminescence have been reported to be low. Irradiation with heavy ions, such as Si ions, as in the latter example produces vacancies concentrated at high concentration immediately around the trajectory through which the heavy ions pass and around the position where the heavy ions finally stop. The present inventor presumes that this will result in leaving a defect, formation of dislocation, or the like, and inhibit the formation of luminescent centers in the vicinity of the vacancies.

An object of the present invention is to provide a method for producing an MV center (luminescent center) containing a metal or metalloid M at high concentration by an efficient technique, and a fluorescent diamond with excellent luminous efficiency.

Solution to Problem

The present inventor developed conditions to produce an optimal luminescent center as a technique to produce an MV center (MV center, M is a metal or metalloid) emitting fluorescence. The technique includes: a first stage to form a diamond containing an appropriate concentration of a target impurity M; and a second stage including ion implantation or high energy beam irradiation, such as electron beam irradiation, and annealing, in which the ion implantation or the high energy beam irradiation is not intended to introduce an impurity but is intended only to introduce a uniform and appropriate certain concentration of vacancies. Such a two-stage process was found to be able to produce a high concentration of the luminescent center.

The present invention provides a fluorescent diamond below and a method for producing the same.

(1) A fluorescent diamond containing an MV center at a concentration of $1\times10^{14}/cm^3$ or higher, wherein M represents a metal or metalloid and V represents a vacancy.

(2) The fluorescent diamond according to (1), satisfying at least one of (i), (ii), or (iii):

(i) having a ratio of the number of vacancies to be introduced to the number of atoms of the metal or metalloid from 0.1 to 10000 (number of V/number of M), (ii) containing from 0.0001 to 1 atomic % of the metal or metalloid (M), or (iii) having a concentration of NV centers of $1\times10^{17}/cm^3$ or lower.

(3) The fluorescent diamond according to (1) or (2), wherein the metal or metalloid element is Si, Ge, or Sn.

(4) The fluorescent diamond according to (1) or (2), wherein the metalloid element is Si.

(5) The fluorescent diamond according to any one of (1) to (4), containing a metal or metalloid element other than the metal or metalloid element constituting the MV center.

(6) The fluorescent diamond according to (5), wherein the metal or metalloid element other than the metal or metalloid element constituting the MV center is Fe, Co, or Ni.

(7) A method of producing the fluorescent diamond described in (1) to (6), including a first stage and a second stage:

the first stage: introducing a proper concentration of a metal or metalloid (M) in a process of synthesis so as to provide a diamond containing the metal or metalloid (M); and the second stage: irradiating the diamond containing the metal or metalloid (M) with a high energy beam to form a vacancy, and subsequently annealing the diamond so as to form an MV center emitting fluorescence.

(8) The method of producing the fluorescent diamond according to (7), wherein the high energy beam is an ion beam of He or H, or an electron beam.

(9) The method of producing the fluorescent diamond according to (7), wherein, in the first stage, a metal or metalloid other than the metal or metalloid element constituting the MV center is allowed to be present.

(10) The method of producing the fluorescent diamond according to (9), wherein the metal or metalloid other than the metal or metalloid element constituting the MV center is Fe, Co, or Ni.

(11) The method of producing the fluorescent diamond according to any one of (7) to (10), wherein the method for the diamond synthesis in the first stage is a chemical vapor deposition method (CVD method).

(12) The method for producing a fluorescent diamond according to any one of (7) to (10), wherein the method for the diamond synthesis in the first stage is a detonation method.

(13) The method for producing a fluorescent diamond according to any one of (7) to (10), wherein the method for the diamond synthesis in the first stage is an implosion method.

Advantageous Effects of Invention

The present disclosure can provide a fluorescent diamond with high luminous efficiency.

DESCRIPTION OF EMBODIMENTS

Methods commonly known for determining the concentration of luminescent centers, such as MV centers, SiV centers, or NV centers in diamond, include an electron paramagnetic resonance (EPR) method, an extinction coefficient method, and a method for directly evaluating fluorescence luminescence intensity. The EPR method is a method for determining the concentration of unpaired electrons in the luminescent center level of the ground state, and the extinction coefficient method is for determining the concentration of electrons transitioning from the ground state to the excited state of the luminescent center. Any of the luminescent center concentrations determined by both techniques does not correspond to the fluorescent luminescence intensity, and the luminescent center concentration corresponding to the fluorescent luminescence intensity is obtained only after multiplying any of those luminescent center concentrations by fluorescent quantum efficiency (which is known to range widely from a value infinitely close to zero to a value close to 1 depending on the environment where the luminescent centers are placed and the like). The luminescent center concentration described in the present invention refers to a fluorescence luminescent center concentration obtained by the technique for evaluating direct fluorescence luminescence intensity or by multiplying a luminescent center concentration obtained by another technique by a fluorescence quantum yield.

The method for directly evaluating fluorescence luminescence intensity can be performed using, for example, a microlaser Raman spectrometer (LabRAM HR) available from HORIBA, Ltd. This is a simple evaluation method, but when a sample with a known luminescent center (e.g., NV center) concentration and a sample containing MV centers are measured for fluorescence luminescence intensity with exactly the same device and under the same conditions, the measured luminescence intensity is proportional to the luminescent center density, the fluorescence quantum yield, and the absorption cross-sectional area of the excited light in the measured volume. The proportionality constant at this time (which reflects a common portion, such as the number of photons of the excitation light and the detection solid angle of the measurement system) can be calculated using the measurement results of a sample with a known luminescent center concentration (For NV centers, samples with a specified luminescent center concentration are commercially available). The concentration of MV centers can be evaluated by using this proportionality constant and assuming literature values for the fluorescence quantum yield and absorption cross section of the MV centers.

(1) Fluorescent Diamond

A fluorescent diamond contains an MV center (M is a metal or metalloid), an M atom, and a vacancy (V).

Examples of the metal represented by M include group 3 elements (scandium, lanthanoid elements, and actinoid elements), group 4 elements (Ti, Zr, and Hf), group 5 elements (V, Nb, and Ta), group 6 elements (Cr, Mo, and W), group 7 elements (Mn), group 8 elements (Fe, Ru, and Os), group 9 elements (Co, Rh, and Ir), group 10 elements (Ni, Pd, and Pt), group 11 elements (Cu, Ag, and Au), group 12 elements (Zn, Cd, and Hg), group 13 elements (Al, Ga, and In), and group 14 elements (Pb), and examples of the metalloid include B, Si, Ge, Sn, P, As, Sb, Bi, Se, and Te. Preferred M is Si, Ge, and Sn, and particularly Si and Ge. One M may be used alone, or two or more M's may be used in combination. When two or more M's are used, two or more metals may be contained, two or more metalloids may be contained, or one or more metals and one or more metalloids may be contained.

In one preferred embodiment, containing a metal or metalloid element other than the metal or metalloid element constituting the MV center may be preferred to increase fluorescence intensity. When a metal or metalloid element other than the metal or metalloid element constituting the MV center is contained, the metal or metalloid element that catalytically constitutes the MV center is probably incorporated into the diamond during diamond film formation, or when conditions are met, the metal or metalloid element probably forms the MV center itself.

The metal or metalloid element other than the metal or metalloid element constituting the MV center is preferably Fe, Co, or Ni, and more preferably Ni. In one preferred embodiment of the present invention, the metal or metalloid element other than the metal or metalloid element constituting the MV center may coexist with the metal or metalloid element constituting the MV center in the interior of the fluorescent diamond but, for example, not in the neighborhood of the MV center, and may be present on or in the vicinity of the surface of the fluorescent diamond.

In one preferred embodiment of the present invention, as shown in Examples 2 and 3, the metal or metalloid element other than the metal or metalloid element constituting the MV center is vapor-deposited on the substrate containing the metal or metalloid element constituting the MV center, and a diamond film containing the metal or metalloid element constituting the MV center is formed by a CVD method or the like on the vapor-deposited metal or metalloid element.

The fluorescent diamond has an MV center as the luminescent center (fluorescent chromophore). The MV center is composed of an M (metal or metalloid) and a V (vacancy) and can emit fluorescence. In the MV center, typically one M and one or a plurality (e.g., two, three, or four, preferably two or three) of V's are present adjacent to each other. For example, an SiV center, a GeV center, an SnV center, and the like are composed of one M and two V's. The NV center has a structure in which two adjacent carbon atoms are replaced by a pair of a nitrogen atom and an atomic vacancy, and one N and one V are present adjacent to each other. The concentration of vacancies introduced by ion implantation or the like can be easily evaluated by simulation.

The concentration of the MV centers of the fluorescent diamond of one preferred embodiment of the present invention is preferably $1\times10^{14}/cm^3$ or higher and, for example, from $2\times10^{14}$ to $1\times10^{19}/cm^3$. In the same type of MV centers, the fluorescence intensity is proportional to the concentration of the MV centers. In addition, an optimal value exists for the MV center concentration. The luminescence intensity is the luminescent center concentration multiplied by the absorption cross-sectional area of the excitation light, the quantum yield, and the like. The absorption cross-sectional area greatly differs depending on the type of luminescent center, and thus the amount of luminescence of different types of luminescent centers cannot be compared only by the concentration.

The density of vacancies introduced into the fluorescent diamond of one preferred embodiment of the present invention is preferably from $1\times10^{16}/cm^3$ to $3\times10^{21}/cm^3$ and more preferably from $1\times10^{18}/cm^3$ to $1\times10^{21}/cm^3$. With too high a density of vacancies, the diamond itself would be broken, and the MV center would not be formed. With too low a density of vacancies, V for forming the MV center (by diffusion of vacancies by annealing and an encounter with and bonding to M) would be insufficient, and thus the MV center concentration would decrease.

When the number of vacancies introduced into the fluorescent diamond relative to the number of M is too small, the concentration of the MV centers would decrease as described above, and thus the luminescence intensity would decrease. The ratio of the number of vacancies to the number of M (number or V/number of M) of the fluorescent diamond of one preferred embodiment of the present invention is from 0.1 to 10000, preferably from 1 to 10000, and more preferably from 1 to 1000.

The M (metal or metalloid) concentration of the fluorescent diamond of one preferred embodiment of the present invention is preferably from 0.0001 to 1 atomic % and more preferably from 0.0005 to 0.1 atomic %. With a higher concentration of M, the MV center concentration also tends to increase, but when a concentration of M is too high, the fluorescence intensity would tend to decrease. Thus, an optimal value exists for the M concentration.

The concentration of the NV center contained in the fluorescent diamond of one preferred embodiment of the present invention is preferably $1\times10^{17}/cm^3$ or lower and more preferably $1\times10^{16}/cm^3$ or lower. The NV center would result in increased background fluorescence for the MV center, and thus the NV center concentration is desirably low.

The fluorescence wavelength of the fluorescent diamond of one preferred embodiment of the present invention is from 650 to 950 nm and preferably from 700 to 900 nm for use as a probe for bioimaging. This is preferred because fluorescence with a fluorescence wavelength in the visible red or near-infrared region easily penetrates the skin or tissue in the body even when cells in the deep portion are fluorescently labeled. When the fluorescence diamond is used in applications other than bioimaging, such as observation at cellular level or quantum application, the range of the fluorescence wavelength is not particularly limited; however, from the viewpoint, such as ease of observation, the fluorescence wavelength is preferably in the range from visible light to near-infrared region.

The shape of the fluorescent diamond is not particularly limited, and the fluorescent diamond may have any shape, such as a sheet shape, a membrane or film shape, a pillar shape (a cylinder or prism), or a granular shape (sphere, ellipsoid, cuboid, cube, or polyhedron). The thickness of the sheet shape or film shape is preferably approximately from 0.5 to 5 μm. The diameter of the pillar or granular shape, or the like is preferably approximately from 2 to 500 nm. The MV center of fluorescent diamond is often preferred to be present throughout the sample but may sometimes be preferred to be present in a portion in the vicinity of the surface.

(2) Method for Producing Fluorescent Diamond

The fluorescent diamond can be produced by a method including using a diamond containing a metal or metalloid (M) as a raw material and irradiating this raw material diamond with a high energy beam to form a vacancy, and annealing the diamond having the formed vacancy to form an MV center.

The concentration of M of the diamond used as a raw material is equivalent to that of the fluorescent diamond described above.

The raw material diamond containing a metal or metalloid (M) can be produced by a known method, for example, by the following methods (I) to (IV):

(I) Using a substrate containing a metal or metalloid element (M) desired to be introduced for diamond synthesis;

(II) Vapor-depositing another metal or the like entirely or partially on a substrate containing a metal or metalloid element (M) desired to be introduced and using the substrate for diamond synthesis;

(III) Adding a gas containing a metal or metalloid element (M) desired to be introduced to a raw material gas; or (IV) Placing an evaporation source of a metal or metalloid element (M) desired to be introduced and a sputtering source in the vicinity of a substrate, and supplying the element desired to be introduced during diamond film formation into a diamond film.

The methods (I) to (IV) described above can be performed by CVD methods, such as a hot filament CVD method or a plasma CVD method but are not limited to these methods. In addition, in producing the diamond raw material by a detonation method, an implosion method (shock compression method), a high temperature-high pressure method, or the like, the diamond raw material containing a metal or metalloid (M) can be produced by producing the diamond in the presence of a compound containing a metal or metalloid.

For the density of vacancies to be introduced into the raw material diamond containing a metal or metalloid (M) by ion beam irradiation or electron beam irradiation, the upper limit is limited by a concentration at which the diamond is broken (a vacancy concentration of $>1\times10^{21}/cm^3$), but the lower limit is, for example, $1\times10^{16}/cm^3$ or higher, or even $1\times10^{18}/cm^3$ or higher. Examples of the high energy beam used for irradiating this diamond raw material with a high energy beam include an ion beam and an electron beam, and the high energy beam is preferably an ion beam. The ion beam is preferably an ion beam of hydrogen (H) or helium (He). For example, the energy of the ion beam of hydrogen is preferably from 10 to 1500 keV, and the energy of the ion beam of helium is preferably from 20 to 2000 keV. The energy of the electron beam is preferably from 500 to 5000 keV.

To make the vacancy concentration the target value (distribution), a technique can be used in which proper injection doses are set by simulation in advance for a plurality of energies referred to as multi-stage injection to obtain concentration distribution in any depth direction. The He ion beam can introduce vacancies to a depth of 800 nm in a diamond with an energy of 360 keV. The H ion beam can introduce vacancies to a depth of 800 nm in a diamond with an energy of 180 keV.

Vacancies could be introduced by irradiation with heavy ions other than H or He ions. However, keeping the equivalent depth of the vacancies that can be introduced would require energy approximately proportional to the atomic number, and this would result in costly irradiation. In addition, vacancies would be concentrated in the immediate vicinity of the ion trajectory and in the vicinity of the stop position, and this would locally increase the vacancy concentration and eventually damage the structure of the diamond itself and probably often interfere with the luminescence. Thus, such a technique seems improper to introduce vacancies.

For electron beam irradiation, the penetration is more pronounced than the ion beam, and, for example, even an electron beam of 500 keV reaches a depth of about 500 μm in diamond. An energy of approximately 400 keV or higher is known to produce a vacancy in diamond. However, the efficiency in producing a vacancy is lower than that of ion implantation, and thus those skilled in the art can appropriately determine the irradiation dose to form sufficient vacancies.

The diamond having vacancies introduced by high energy irradiation is subjected to annealing treatment to diffuse the vacancies and form the MV centers, and this can cause fluorescence luminescence. The annealing temperature is preferably 600° C. or higher, more preferably from 700 to 1600° C., and even more preferably from 750 to 900° C. The annealing time is preferably from 5 to 60 minutes and more preferably from 10 to 30 minutes.

A monocrystalline or polycrystalline fluorescent diamond with a thickness of approximately several μm or less can be pulverized into a fluorescent nanodiamond.

The formation of vacancies in ion implantation or electron beam irradiation also means formation of C atoms having deviated from the lattice sites and moved to interstitial spaces. Such interstitial C atoms may also diffuse under conditions approximately the same as the diffusion conditions for the vacancies, reach the surface, and form an amorphous layer or a graphite layer. The presence of these layers is desirably removed, as those may cause absorption of excitation light or fluorescence. The amorphous layer or graphite layer can be removed by gas phase oxidation or liquid phase oxidation.

EXAMPLES

Hereinafter, the present invention will be described more specifically with reference to examples, but the present invention is not limited by these examples.

(1) Example 1

A sample prepared by cleaving a commercially available silicon substrate in about 2 cm squares is used as a substrate. One or two drops of a commercially available nanodiamond dispersion liquid (e.g., MSYO-0.5 GAF available from Microdiamant) are dropped onto the silicon substrate with a dropper and rubbed on the substrate surface with a cotton swab. This is intended to cause micro scratches on the silicon substrate surface to make a starting point for deposition of a diamond film to grow later as well as to use the nanodiamond remaining on the substrate as a nucleus for diamond growth. The silicon substrate thus pre-treated was introduced into a hot filament CVD apparatus.

Figure 2:
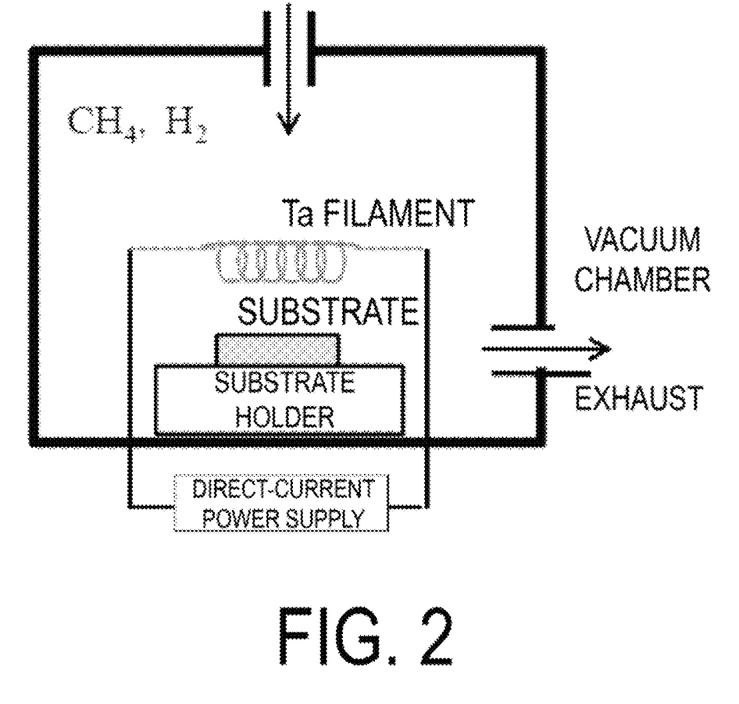
FIG. 2 is a conceptual diagram of a hot filament CVD apparatus.

A conceptual drawing of a hot filament CVD apparatus is illustrated in FIG. 2. The hot filament CVD apparatus has a Ta filament, an electrode supporting the filament, and a substrate holder in a stainless vacuum chamber, and a filament power source (direct-current power source) is connected to the filament from outside the vacuum chamber. A supply system for raw material gases ($CH_4$ and $H_2$); and a vacuum system including a high vacuum pump (turbo-molecular pump) and a low vacuum pump (rotary pump), and a vacuum gauge are connected to the vacuum chamber. Although a tantalum wire is typically used for the filament, a high melting point metal wire, such as a tungsten wire or a niobium wire, can also be used.

Hot filament CVD was carried out by placing the pre-treated silicon substrate on the substrate holder, then fixing the filament at a position about 7 mm from the substrate, vacuuming with the vacuum system at a level of $1\times10^{-3}$ Pa or lower, stopping the high vacuum pump, then allowing the raw material gases $CH_4$ to flow at 3 sccm and $H_2$ at 200 sccm, and applying power to the filament after the pressure inside the vacuum chamber was stabilized at about 10 kPa. The film formation was carried out at a filament power of 250 W for 2 hours.

Figure 3:
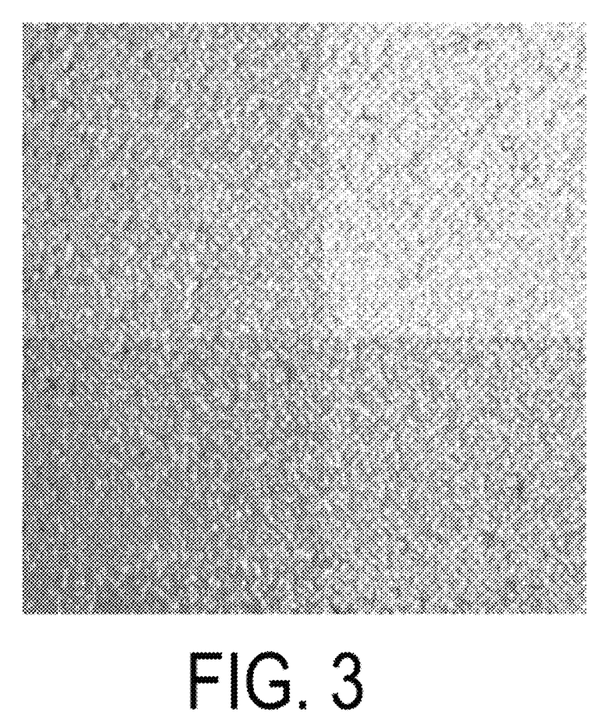
FIG. 3 is an optical micrograph of a sample surface immediately after diamond film formation in Example 1, illustrating a region of 100 μm×100 μm.
Figure 4:
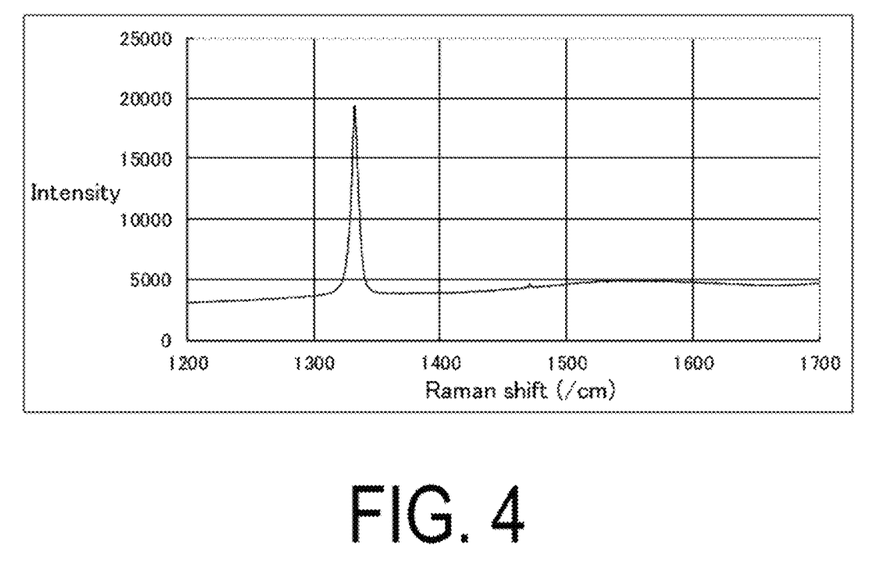
FIG. 4 is a Raman scattering spectrum immediately after diamond film formation in Example 1.
Figure 5:
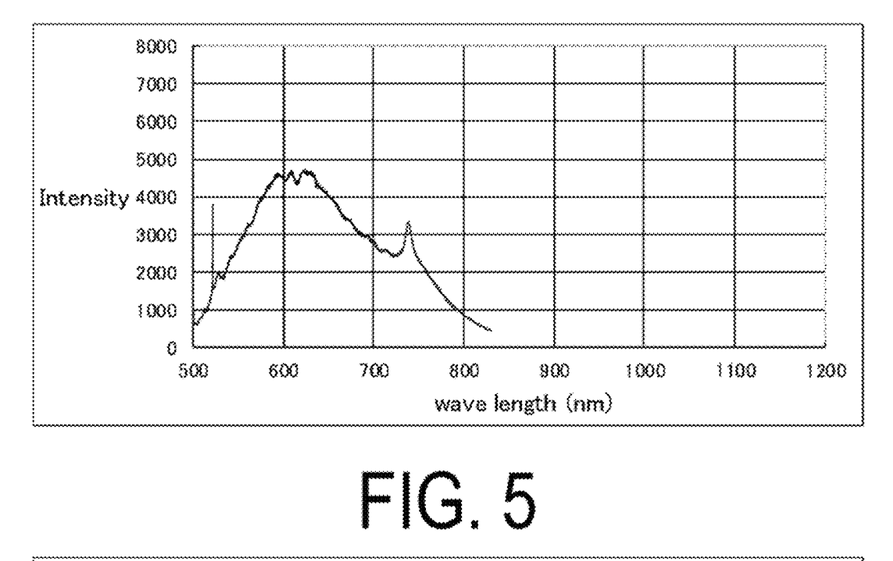
FIG. 5 is a photoluminescence (PL) measurement result immediately after diamond film formation in Example 1.

The polycrystalline diamond film after the film formation had a film thickness of approximately 1.5 μm. The size of crystal grains is approximately 2 μm in the central portion (location close to the filament) of the substrate, becomes smaller toward the periphery, and is 1 μm or less at the end portion. FIG. 3 illustrates an optical micrograph of an intermediate portion between the central portion and the peripheral portion of the diamond film. FIG. 4 shows a Raman scattering spectrum measured at this portion of the sample. A micro Raman spectrometer LabRAM HR available from HORIBA was used for the measurement with an excitation light wavelength of 488 nm. A peak at 1332/cm, which is characteristic of diamond, is clearly observed, indicating that a good quality diamond is formed. FIG. 5 shows a result of PL measurement in this state with the same device (LabRAM HR). A luminescence peak of the SiV center is observed at a position of 738 nm. This spectrum is typical of polycrystalline diamond samples immediately after film formation by hot filament method. The concentration of SiV centers determined based on the fluorescence luminescence intensity measured with a micro Raman spectrometer LabRAM HR available from HORIBA is estimated to be approximately $6\times10^{12}/cm^3$ (concentrations in diamond estimated by the same technique are shown in the present specification but they are merely reference values). The broad luminescence with a peak from 600 to 630 nm is close to the luminescence of the NV center in terms of wavelength but has no characteristic of the luminescence spectrum of the NV center. Thus, this is probably not luminescence of the NV center but luminescence of an organic substance produced in grain boundaries of the diamond.

The diamond sample was then irradiated with a 2 MeV He beam in a range of $6\times10^{13}/cm^2$ to $6\times10^{15}/cm^2$ (from $1\times10^{18}$ to $1\times10^{20}/cm^3$ in terms of the vacancy concentration), followed by annealing in vacuo at 800° C. for 10 minutes, and then followed by atmospheric oxidation at 470° C. for 2 hours. The sample thus having undergone the ion irradiation and heat treatment was subjected to PL measurement with the device used to measure the Raman scattering spectrum. FIG. 6 shows the result of the PL measurement after annealing of the sample ion-irradiated at a $2\times10^{15}/cm^2$ condition. The luminescence intensity of the SiV centers is approximately 30 times (the concentration of the SiV centers is approximately $1.8\times10^{14}/cm^3$) compared to that immediately after the film formation. The intensity of the broad luminescence on the short wavelength side slightly increased, but no characteristic unique to the luminescence of the NV center is observed, thus suggesting no inclusion of the NV center and satisfying the requirement: "a concentration of NV centers is $1\times10^{17}/cm^3$ or lower".

(2) Example 2

Pretreatment of a silicon substrate piece was carried out by placing a small amount of a commercially available nanodiamond in powder form (e.g., MSYO-0.5 available from Microdiamant) on the silicon substrate and rubbing the nanodiamond on the substrate surface using a cotton swab. The substrate thus pre-treated was vapor-deposited with nickel with a film thickness of about 50 nm on a portion approximately half the area of the sample surface using a magnetron sputter device. A diamond film was formed using this substrate and using the hot filament CVD apparatus illustrated in FIG. 2 in the same manner as in Example 1.

Figure 7:
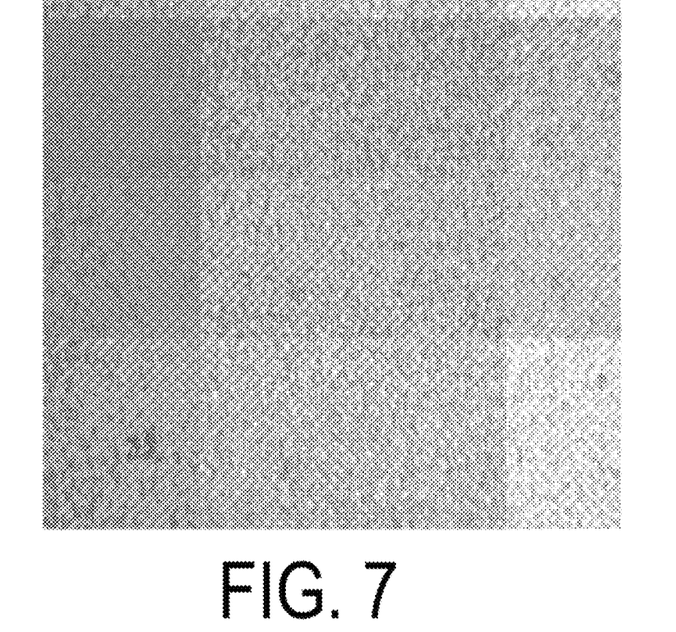
FIG. 7 is an optical micrograph of a sample surface (a location of Ni vapor deposition) immediately after diamond film formation in Example 2, illustrating a region of 100 μm×100 μm.
Figure 8:
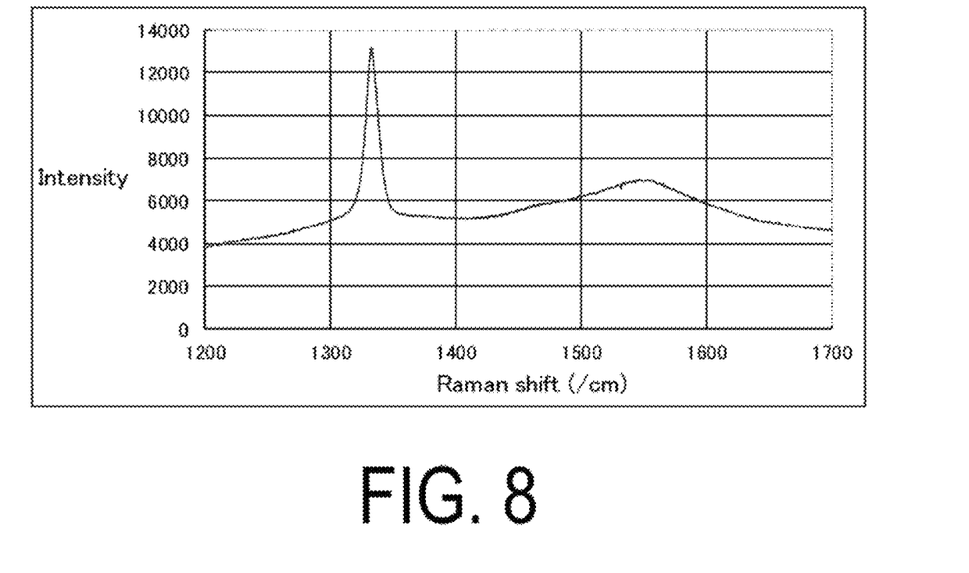
FIG. 8 is a Raman scattering spectrum immediately after diamond film formation in Example 2.
Figure 9:
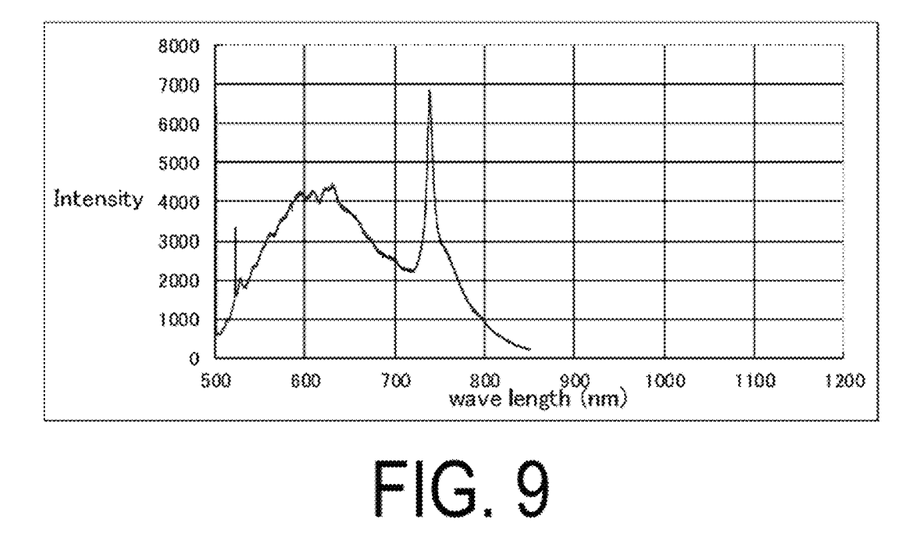
FIG. 9 is a PL measurement result immediately after diamond film formation in Example 2.

The film forming conditions were approximately the same as in Example 1; the filament was fixed at a position about 7 mm from the substrate, vacuuming was performed with the vacuum system at a level of $1\times10^{-3}$ Pa or lower, and after the high vacuum pump was stopped, the raw material gases $CH_4$ were allowed to flow at 3 sccm and $H_2$ at 200 sccm, and after the pressure inside the vacuum chamber was stabilized at about 10 kPa, power was applied to the filament. The film formation was carried out at a filament power of 250 W for 2 hours. As a result, a diamond film grew on the entire substrate, and distributions of particle size and film thickness approximately the same as those of Example 1 were obtained. Of these, an optical micrograph of the sample surface in the nickel vapor deposition region is illustrated in FIG. 7, a Raman scattering spectrum measured in the peripheral region is shown in FIG. 8, and a PL measurement result in FIG. 9. A clear diamond peak at 1332/cm is observed in the Raman scattering measurement, indicating that a good quality diamond is formed as in Example 1. The result of the PL measurement indicates that SiV centers with a high concentration ($3\times10^{13}/cm^3$ according to the same concentration evaluation method), approximately 5 times that in Example 1, are formed immediately after the film formation.

Figure 10:
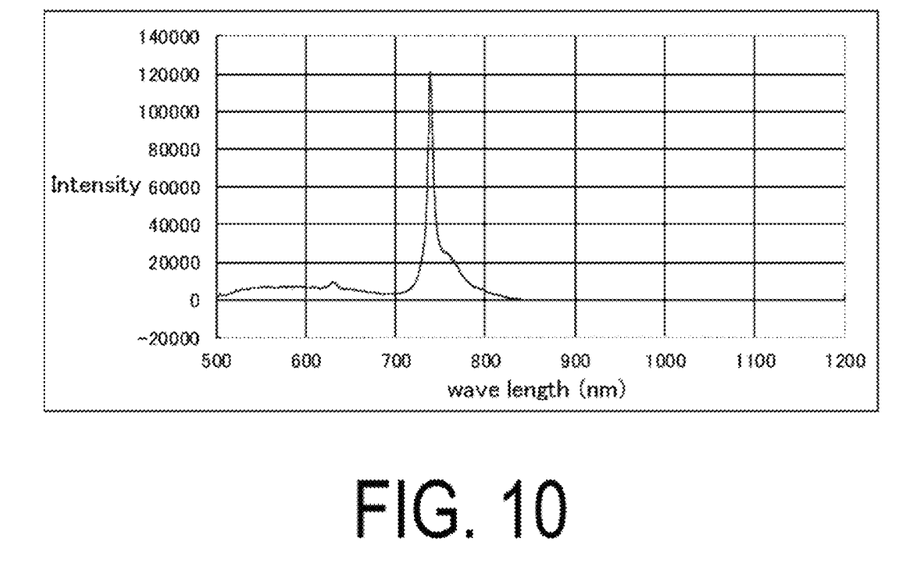
FIG. 10 is a PL measurement result after completion of ion irradiation and annealing treatment of the diamond film in Example 2, where the vertical axis indicates 1/10 of actual values because a neutral density filter was used.

This sample was likewise subjected to ion implantation with a He beam and annealing treatment. The highest concentration of the SiV center was obtained under injection conditions of $6\times10^{15}/cm^2$. The result of the PL measurement is shown in FIG. 10. The SiV center concentration determined from the luminescence intensity of the SiV centers obtained here is estimated to be $7\times10^{14}/cm^3$. This concentration is far from the concentration of SiV centers naturally produced after CVD film formation, and an attempt of introducing this concentration of Si by Si ion implantation would cause irreparable damage to diamond. Thus, this concentration is probably achieved only after applying the technique of the present invention.

No characteristic unique to the luminescence of the NV center is observed as in Example 1, thus suggesting no inclusion of the NV center and satisfying the requirement: "a concentration of NV centers is $1\times10^{17}/cm^3$ or lower".

Although the mechanism by which the partial nickel film formation before diamond film formation increases the concentration of the produced SiV center has not been clearly analyzed, the present inventor presumes that nickel and silicon in the diamond or on the surface of the diamond are distributed beyond the boundary of the vapor deposition region, and this allows both elements to function as catalysts during diamond film formation and to be mixed as the diamond grows, and the presence of nickel increases the effect of the mixing compared to that in the absence of nickel, and this result in the increased incorporation of silicon atoms into the diamond.

(3) Example 3

Figure 11:
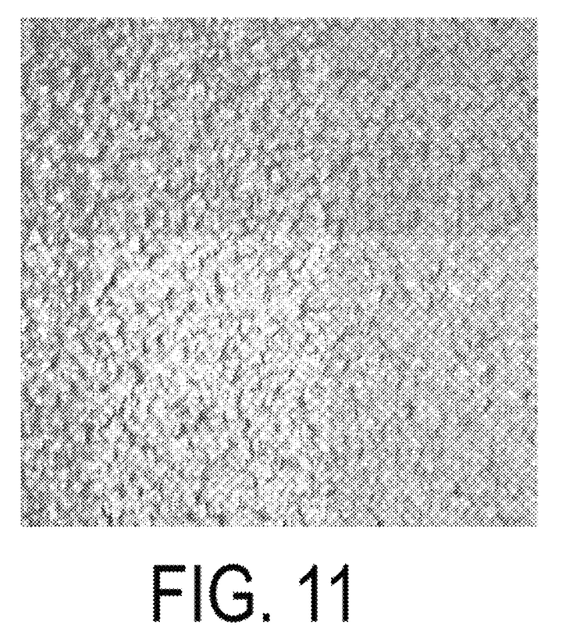
FIG. 11 is an optical micrograph of a sample surface (a location of Ni vapor deposition) immediately after diamond film formation in Example 3, illustrating a region of 100 μm×100 μm.
Figure 12:
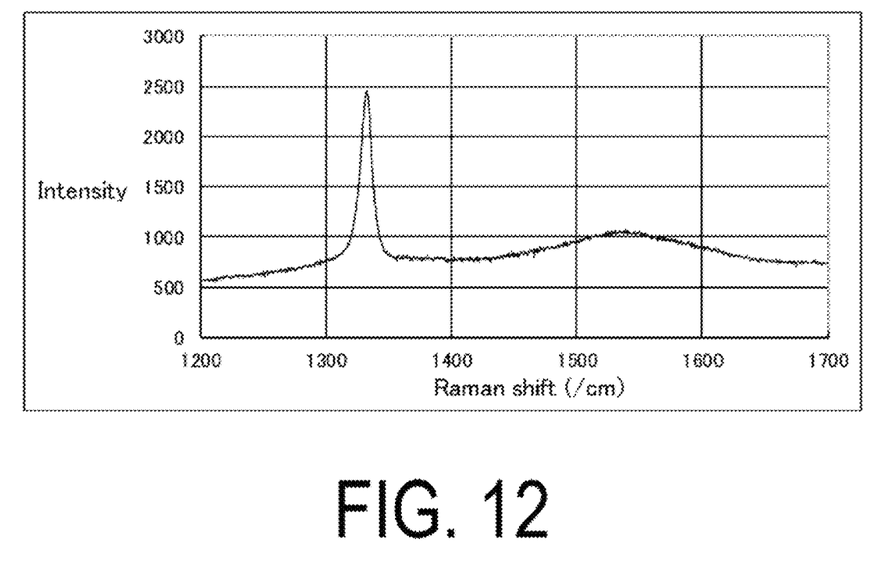
FIG. 12 is a Raman scattering spectrum immediately after diamond film formation in Example 3.
Figure 13:
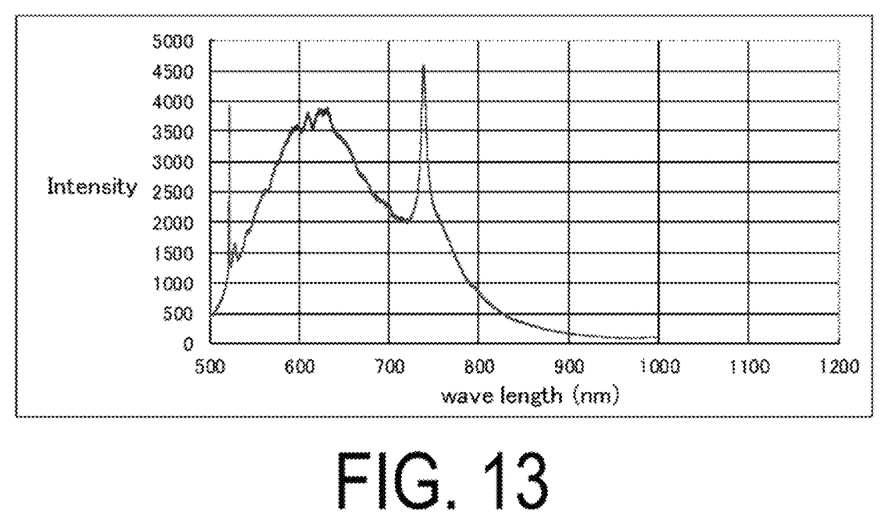
FIG. 13 is a PL measurement result immediately after diamond film formation in Example 3.

After a silicon substrate was pre-treated using a commercially available nanodiamond as in Example 2, a cobalt film was formed on approximately half the area of the sample surface using a magnetron sputter device. The film thickness of cobalt was about 50 nm. A diamond film was formed using this substrate and using the hot filament CVD apparatus illustrated in FIG. 2 in the same manner as in Examples 1 and 2. The film forming conditions were approximately the same as in Examples 1 and 2; the filament was fixed at a position about 7 mm from the substrate, vacuuming was performed with the vacuum system at a level of $1\times10^{-3}$ Pa or lower, and the high vacuum pump was stopped, the raw material gases $CH_4$ were allowed to flow at 3 sccm and $H_2$ at 200 sccm, and after the pressure inside the vacuum chamber was stabilized at about 10 kPa, power was applied to the filament. The film formation was carried out at a filament power of 250 W for 2 hours. As a result, a diamond film grew on the entire substrate, and distributions of particle size and film thickness approximately the same as those of Examples 1 and 2 were obtained. Of these, an optical micrograph of the sample surface in the cobalt vapor deposition region is illustrated in FIG. 11, a Raman scattering spectrum measured in the peripheral region is shown in FIG. 12, and a PL measurement result in FIG. 13. Those results revealed a clear diamond peak observed at 1332/cm in the Raman scattering measurement as in Examples 1 and 2, indicating that a good quality diamond is formed. The result of the PL measurement was approximately 3 times that in Example 1 and about 0.6 times that in Example 2, indicating that SiV centers with a concentration ($1.8\times10^{13}/cm^3$ according to the same concentration evaluation method) between the concentration obtained without metal sputtering and the concentration obtained in the presence of the nickel film are formed immediately after the film formation.

Figure 14:
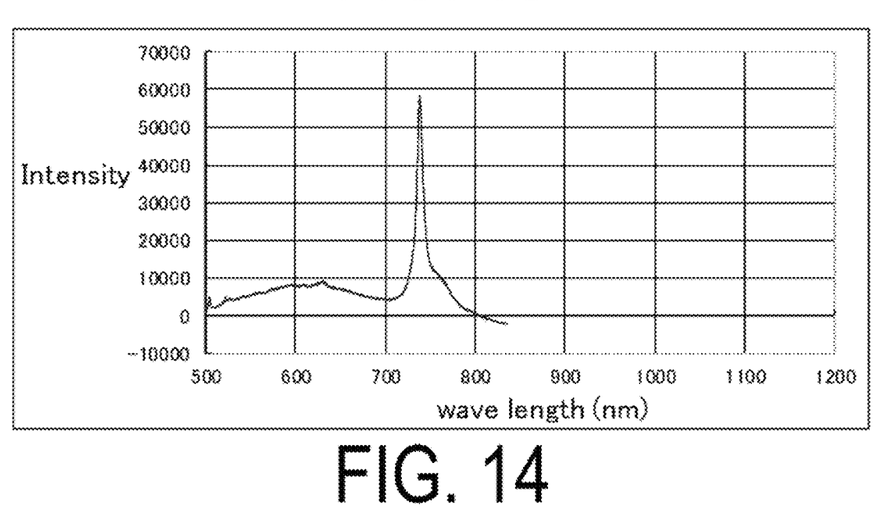
FIG. 14 is a PL measurement result after completion of ion irradiation and annealing treatment of the diamond film in Example 3.

This sample was likewise subjected to ion implantation with a He beam and annealing treatment. The highest concentration of the SiV center was obtained under injection conditions of $6\times10^{14}/cm^2$. The result of the PL measurement is shown in FIG. 14. The luminescence intensity of the SiV centers obtained here is about half the result of the sample obtained by forming the nickel film shown in Example 2, and the concentration is estimated to be approximately $3.5\times10^{14}/cm^3$. Although the concentration is thus not comparable to that of Example 2 where the nickel was used, the effect of increasing the SiV center concentration by metal vapor deposition is apparent. Thus, the present inventor presumes that other transition metals, such as iron, also have the same effect.

No characteristic unique to the luminescence of the NV center is observed as in Example 1, thus suggesting no inclusion of the NV center and satisfying the requirement: "a concentration of NV centers is $1\times10^{17}/cm^3$ or lower".

The invention claimed is:

1. A fluorescent diamond comprising an MV center at a concentration of $1\times10^{14}/cm^3$ or higher, wherein M represents a metal or metalloid, and V represents a vacancy, wherein the fluorescent diamond satisfies (i), (ii), and (iii)
   (i) having a ratio of the number of vacancies to be introduced to the number of atoms of the metal or metalloid of from 0.1 to 10000 (number of V/number of M);
   (ii) containing from 0.0001 to 1 atomic % of the metal or metalloid (M); and
   (iii) having a concentration of NV (Nitrogen-Vacancy) centers of $1\times10^{17}/cm^3$ or lower,
   wherein no characteristic unique to the luminescence of the NV center is observed, and
   wherein the density of vacancies of the fluorescent diamond is from $1\times10^{16}/cm^3$ to $3\times10^{21}/cm^3$.

2. The fluorescent diamond according to claim 1, wherein the metal or metalloid element is Si, Ge, or Sn.

3. The fluorescent diamond according to claim 1, wherein the metalloid element is Si.

4. The fluorescent diamond according to claim 1, comprising a metal or metalloid element other than the metal or metalloid element constituting the MV center.

5. The fluorescent diamond according to claim 4, wherein the metal or metalloid element other than the metal or metalloid element constituting the MV center is Fe, Co, or Ni.

6. A method of producing the fluorescent diamond described in claim 1, comprising a first stage and a second stage:
   the first stage: introducing a proper concentration of a metal or metalloid (M) in a process of diamond synthesis so as to provide a diamond comprising the metal or metalloid (M); and
   the second stage: irradiating the diamond comprising the metal or metalloid (M) with a high energy beam to form a vacancy, and subsequently annealing the diamond so as to form an MV center emitting fluorescence.

7. The method of producing the fluorescent diamond according to claim 6, wherein the high energy beam is an ion beam of He or H, or an electron beam.

8. The method of producing the fluorescent diamond according to claim 6, wherein in the first stage, a metal or metalloid other than the metal or metalloid element constituting the MV center is allowed to be present.

9. The method of producing the fluorescent diamond according to claim 8, wherein the metal or metalloid other than the metal or metalloid element constituting the MV center is Fe, Co, or Ni.

10. The method of producing the fluorescent diamond according to claim 6, wherein a method for the diamond synthesis in the first stage is a chemical vapor deposition method (CVD method).

11. The method of producing the fluorescent diamond according to claim 6, wherein the method for the diamond synthesis in the first stage is a detonation method.

12. The method for producing a fluorescent diamond according to claim 6, wherein the method for the diamond synthesis in the first stage is an implosion method.

* * * * *